Figure 1:
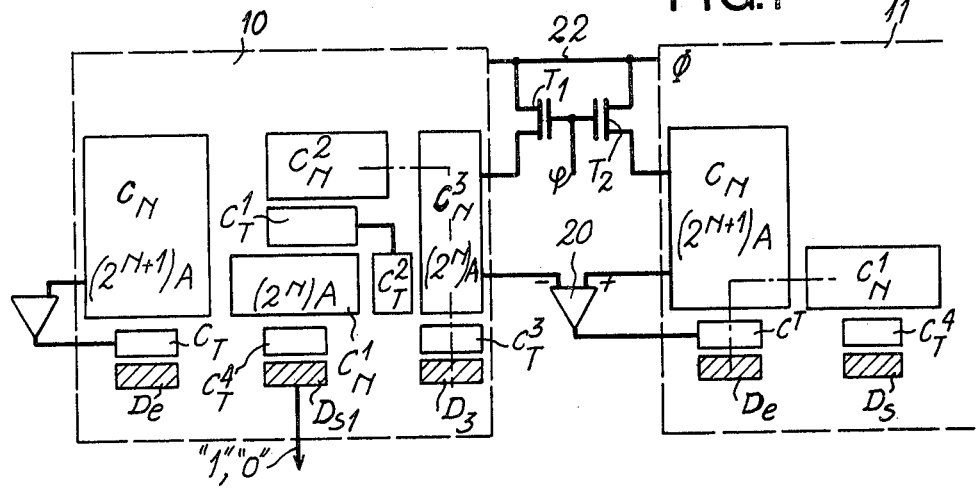

United States Patent [19]

Feldmann et al.

[11] 4,307,382
[45] Dec. 22, 1981

[54] ANALOG-TO-DIGITAL CONVERTER MAKING USE OF A CHARGE-TRANSFER DEVICE

[76] Inventors: Michel Feldmann, 15, rue Saint Lambert, 75015 Paris; Jean Godin, 8, Avenue du Gouverneur Général Binger, 94100 Saint Maur; Jeannine Hénaff, 3Ter, Place Marquis, 92140 Clamart, all of France

[21] Appl. No.: 171,470

[22] Filed: Jul. 23, 1980

[30] Foreign Application Priority Data

Aug. 1, 1979 [FR] France ............................... 79 19791

[51] Int. Cl.³ ........................................... H03K 13/09
[52] U.S. Cl. ............................. 340/347 AD; 357/24; 307/221 D
[58] Field of Search ...................... 357/24; 307/221 D; 340/347 AD, 347 DA, 347 M

[56] References Cited

U.S. PATENT DOCUMENTS

| | | | |
|---|---|---|---|
| 2,832,827 | 4/1958 | Metzger | 340/347 AD |
| 4,072,938 | 2/1978 | Buchanan | 340/347 AD |
| 4,115,766 | 9/1978 | Smith | 340/347 AD |
| 4,164,734 | 8/1979 | Jensen | 340/347 AD |

Primary Examiner—Charles D. Miller

[57] ABSTRACT

An analog-to-digital converter comprising a plurality of conversion stages, each of said stages containing a charge transfer device constituted by a storage electrode mounted at the input, by a storage electrode mounted at the output and by intermediate auxiliary electrodes, the area of the output electrode being K times smaller than that of the input electrode, said converter being characterized in that it contains a means for multiplying charges in the ratio K/1, said means being inserted between the output electrode of each stage and the input electrode of the following stage, and in that all the stages are identical.

4 Claims, 3 Drawing Figures

ANALOG-TO-DIGITAL CONVERTER MAKING USE OF A CHARGE-TRANSFER DEVICE

The present invention relates to an analog-to-digital converter making use of a charge transfer device. It has an application in the field of signal processing and more particularly in the field of telecommuications.

There exist a large number of devices adapted to convert an analog quantity (usually, an electrical voltage) into a number (either decimal or binary). A general exposition on that matter can be found in a special issue of "IEEE Transactions on Circuits and Systems", published in July 1978, vol. CAS-25, No. 7.

Some of the known converters make use of charge-transfer devices. In particular, an article by W. J. Butler, entitled "Monolithic Charge Transfer A/D Converter", published in the above review, at pages 497–503, discloses a device that operates as follows: a standard potential well (or trough) is filled with a bundle of charges up to a given threshold voltage; said bundle of charges is subsequently depleted by an amount proportional to the voltage to be converted; it is then filled up with a succession of N unitcharges, again up to said threshold voltage. Number N therefore constitutes a numerical measurement of the applied voltage.

Such a device has the obvious drawback that no new conversion can be undertaken until the N charge-units have been injected into the standard well: accordingly, a conversion will require at least N clock-strokes. Such a converter is therefore inherently slow, as are in fact all integration-based converters.

Now, the problem of a rapid analog-to-digital conversion is one of the most critical in the field of telecommunications, so that a device of that type is of no practical use as regards such an application.

In addition, analog-to-digital converters are known that make use of such charge-transfer devices according to the following principle: the charges representing the quantity to be converted are shifted under a row of electrodes, the latter being coupled to auxiliary electrodes; The areas and, accordingly, the capacities of the electrode potential wells are divided by two from one stage to the following one. Each stage carries out a division by two of the number of charges received from the preceeding stage, the remainder of such a division being transmitted to the following stage. Therefore, each stage delivers a "1" signal or a "0" signal according as the respective auxiliary electrode receives charges or not. A converter of that type is described in U.S. Pat. No. 4,136,335, granted on Jan. 23, 1979, entitled "Semiconductor Charge Couple Device Analog-to-Digital Converter".

The main drawback of such a device is that it is of necessity restricted to a few bits (about 6 bits), in view of the gradual area reduction (in the 2/1 ratio) of the electrodes from one stage to the following one. Beyond 6 bits, it is very difficult to manufacture electrodes with very small dimensions.

The object of the present invention is precisely to provide an analog-to-digital converter exempt from the drawbacks of the above two devices of the prior art, since it is most rapid, on the one hand, and it is free from the above trouble regarding the electrode dimensions, on the other hand.

The converter according to the present invention is based on the following principle: its conversion stages are stages similar to those disclosed in the above-mentioned U.S. patent, or the like; however, the charges constituting the remainder of the division by 2 carried out in a given stage, instead of being directly transmitted from said stage to the following one, are first multiplied by 2, so that the following stage can be identical to said stage. Accordingly, all the stages of the converter become similar, which cancels the above mentioned drawback associated with the electrode dimension decrease. Therefore, in the converter according to the present invention, the number of the bits used no longer has an upper limit; that number can be for instance equal to 12, which is not possible with converters of the prior art. In addition, since all the stages are similar, the converter according to the present invention can be manufactured much more easily and it can even be mass-produced.

Quite obviously, conversion in the base 2-system is but a mere example and it would be possible to resort to any other base, e.g. base 10, in which case the converter would be a decimal instead of a binary converter.

Similarly, each stage of the converter can comprise several 1-bit conversion sub-stages, for instance three, in which case a given stage provides three bits according to the well known principle, the multiplication of the charges at the exit of such a triple stage being then carried out according to the ratio $2^3=8$.

More specifically, the object of the present invention is to provide an analog-to-digital converter comprising a plurality of conversion stages, each of said stages containing a charge transfer device constituted by a storage electrode mounted at the input, by a storage electrode mounted at the output and by intermediate auxiliary electrodes, the area of the output electrode being K times smaller than that of the input electrode, said converter being characterized in that it contains a means for multiplying charges in the ratio K/1, said means being inserted between the output electrode of each stage and the input electrode of the following stage, and in that all the stages are identical.

Preferably, said converter is characterized in that said ratio K/1 is equal to 2, said intermediate electrodes and each of said output storage electrodes all having the same area, said area being equal to half the area of the respective input storage electrode, conversion being then carried out in the binary system.

Figure 2:
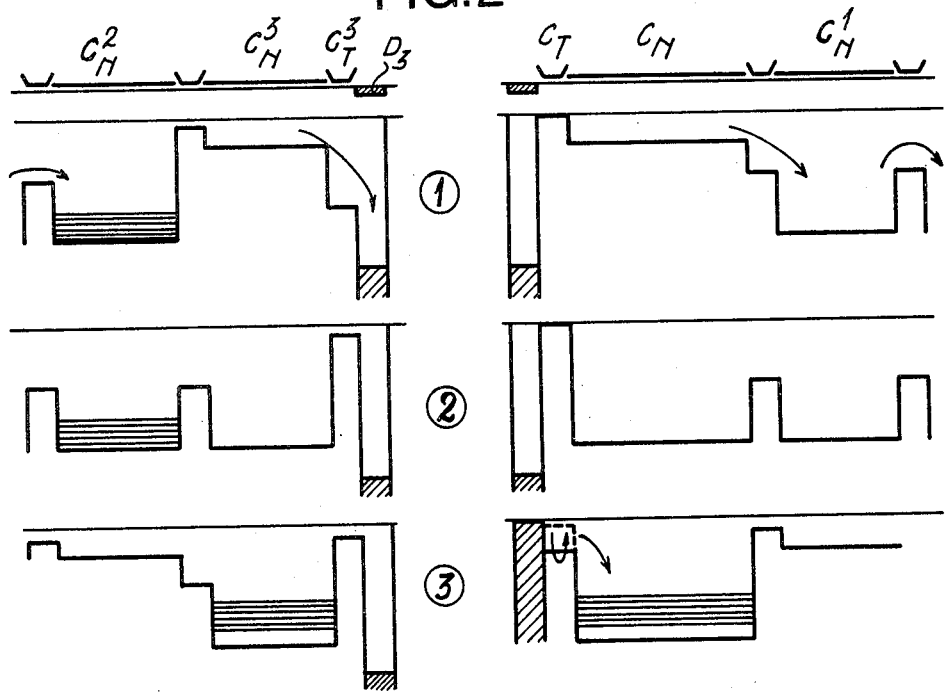
Figure 3:
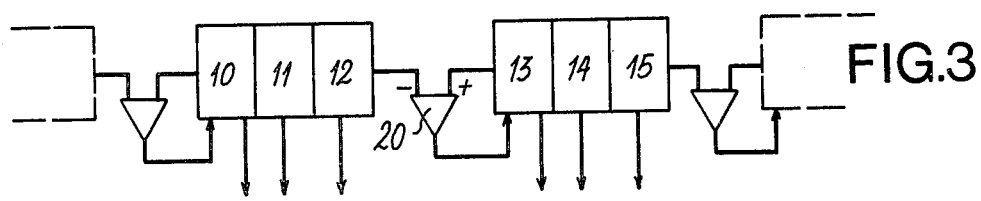

Other features of the present invention will appear from the following description, given merely by way of example, with reference to the accompanying drawing, in which:

FIG. 1 diagrammatically shows a charge transfer converter according to the invention;

FIG. 2 is a diagrammatic cross-section of said converter, in three different phases; and FIG. 3 represents a variant of said converter.

The following description will be restricted to the main means of the invention and will leave aside the structural parts of charge transfer devices, the latter being widely known. For any particulars regarding such devices, reference may be had to the book by Carlo H. Sequin and Michael F. Tompsett, entitled "Charge transfer devices", published in 1975 by Academic Press, Inc.

Similarly, as regards the device for the input of charges into the converter, reference may be had to an article by M. F. Tompsett, entitled "Surface equilibration method of setting charges in CCD", published in IEEE Transactions on Electron Devices ED. 22, p. 305, 309, June 1975, and also to an article by C. H. Sequin et al entitled "Linearity of electrical charge injection into CCD" published in IEEE Journal of Solid State Circuits, SC-10, p. 81 92, April 1975.

Finally, the converter according to the present invention makes use of conditional transfer electrodes, a description of which is to be found in an article by R. J. Handy, entitled "Use of CCD in the development of digital logics" published in IEEE Transactions on Electron Devices, ED 24, No. 8, August 1977, p. 1049–1061.

The device as shown in FIG. 1 comprises a conversion stage 10 constituted by:
- a storage electrode $C_N$, the area of which is $2^{N+1}A$;
- a storage electrode $C_N{}^1$, the area of which is $2^N A$, coupled with $C_N$;
- a storage electrode $C_N{}^2$, the area of which is $2^N A$, said electrode being separated from $C_N{}^1$ by a transfer electrode $C_T{}^1$;
- a storage electrode $C_N{}^3$, the area of which is $2^N A$, said electrode being coupled with $C_N{}^2$ and separated from $C_N{}^1$ by a transfer electrode $C_T{}^2$.

Electrode $C_N{}^1$ is connected to an output diode Ds1 by a transfer electrode $C_T{}^4$, whereas electrode $C_N{}^3$ is connected to a diode (D3) by a transfer electrode $C_T{}^3$.

Between each pair of conversion stages (10, 11, etc.), is inserted a differential amplifier 20 with two inputs, viz. a positive input and a negative input, the former being connected to electrode $C_N{}^2$ of the preceding stage, whereas the latter is connected to electrode $C_N$ of the following stage, and also to an output connected to transfer electrode $C_T$ connected to input diode $D_e$.

Between each pair of stages are also to be found two transistors $T_1$ and $T_2$ mounted across a line 22 at potential $\Phi$, the bases of said transistors being connected with each other and at potential $\psi$.

FIG. 2 illustrates the operation of said device and shows how surface voltages under various electrodes vary with respect to the potentials applied thereto. Said operation comprises the following three steps in which the signs correspond to a device in which the charges transferred are electrons:

First step:

$\phi$ is at a high potential: transistors $T_1$ and $T_2$ are "on" and electrodes $C_N{}^3$ and $C_N$ are brought to potential $\Phi$, of low level: the charges under electrodes $C_N{}^3$ and $C_N$ are discharged into diode $D_3$ (brought to a high potential) and under electrode $C_N{}^1$, respectively, and, contingently, under $C_N{}^2$ if the amount of charges is greater than the capacity of $C_N{}^1$.

Second step:

$\Phi$ is brought to a high potential, then reset to zero: transistors $T_1$ and $T_2$ are "off" and electrodes $C_N{}^3$ and $C_N$ are at floating potentials and ready to receive charges.

During the above two steps, electrode $C_N{}^3$ of a given stage and electrode $C_N$ of the following stage remain at the same potential, and amplifier 20 constrains $C_T$ to voltage zero; diode $D_e$ is raised to a high potential.

Third step:

The charges contained under $C_N{}^2$ are transferred under $C_N{}^3$ and, contingently, under $C_N{}'$ (conditional transfer through $C_T{}^2$). These charges induce a negative potential variation $\Delta$ in floating electrodes, said variation being proportional to the charge and inversely proportional to the electrode area. Accordingly, amplifier 20 induces a positive voltage in $C_T$, which permits the injection of charges from diode $D_e$ (the latter being earthed) under electrode $C_N$. The floating potential of said electrode decreases so long as charges are fed. As soon as the potential of $C_N$ is equal to that of $C_N{}^3$, the voltage applied to $C_T$ is reset to zero, thus interrupting the injection of charges under $C_N$. The amounts of charges under $C_N$ and $C_N{}^3$ are in the same ratio as that of the areas of said electrodes (viz. 2, in the present instance): a duplication of charges has occurred between stage 10 and stage 11.

Whenever the amount of charges under $C_N$ is smaller than the capacity of the well under $C_N{}^1$, the signal delivered by $D_s$ is zero and the bit corresponding to that stage is "0". On the other hand, if said amount of charges is greater than the well capacity, the bit is "1". Transfer from $C_N{}'$ to $C_N{}^3$ is merely conditional and occurs only in the first case; in the second case, the well is fully depleted by $D_s$ and only the charges of $C_N{}^2$ are transferred to $C_N{}^3$, $C_T{}^1$ then interrupting $C_T{}^2$.

The above process is continued stage to stage.

To sum up, each stage carries out the division by 2 of the charges fed thereto (or a "weighing" of said charges), the remainder of the division being subsequently multiplied by 2 in the course of its transfer to the following stage.

Amplifier 20 can be mounted anywhere; however, it will be preferably integrated to the charge transfer device. Quite obviously, the present invention is not restricted to the use of an operational amplifier and can be extended to any device capable of multiplying charges, and, more generally, to any device capable of determining the two potentials of the electrodes by means of an injection of charges.

FIG. 3 shows a converter in which each conversion stage is a three-bit stage, and is constituted by three substages (10, 11, 12) or (13, 14, 15) ..., each of which is similar to stage 10 of FIG. 1. A charge multiplying amplifier 20 is inserted between each pair of such three-bit stages. Such a converter delivers 3-bit multiplets.

What is claimed is:

1. In an analog-to-digital converter of the type comprising a plurality of conversion stages, each of which contains a charge transfer device constituted by a storage electrode mounted at the input, by a storage electrode mounted at the output and by intermediate auxiliary electrodes (the area of each of said output electrodes being K times smaller than that of the respective input electrode), means for multiplying charges in the ratio K/1, said means being inserted between the output electrode of each of said stages and the input electrode of the respective following stage, all of said stages being identical.

2. A converter according to claim 1, wherein said ratio K/1 is equal to 2, said intermediate electrodes and each of said output storage electrodes all having the same area, said area being equal to half the area of the respective input storage electrode, conversion being then carried out in the binary system.

3. A converter according to claim 2, further comprising:
- a storage electrode $C_N$, the area of which is $2^{N+1}A$,
- a storage electrode $C_N{}^1$, the area of which is $2^N A$, coupled with $C_N$,
- a storage electrode $C_N{}^2$, the area of which is $2^N A$, said electrode being separated from $C_N{}^1$ by a transfer electrode $C_T{}^1$, and
- a storage electrode $C_N{}^3$, the area of which is $2^N A$, said electrode being coupled with $C_N{}^2$ and separated from $C_N{}^1$ by a transfer electrode $C_T{}^2$.

4. A converter according to claim 3, wherein said means for multiplying charges is an amplifying circuit with two inputs, viz. a positive input and a negative input, the former being connected to electrode $C_N{}^2$ of the preceding stage, whereas the latter is connected to electrode $C_N$ of the following stage, and also to an output connected to a transfer electrode $C_T$ connected to an input diode $D_e$.

* * * * *